United States Patent
Tanaka et al.

(10) Patent No.: US 10,043,677 B2
(45) Date of Patent: Aug. 7, 2018

(54) METHOD FOR MANUFACTURING FILLING PLANARIZATION FILM AND METHOD FOR MANUFACTURING ELECTRONIC DEVICE

(71) Applicant: MITSUI CHEMICALS, INC., Minato-ku, Tokyo (JP)

(72) Inventors: Hirofumi Tanaka, Tsukuba (JP); Yasuhisa Kayaba, Urayasu (JP); Hiroko Wachi, Chiba (JP); Koji Inoue, Ichihara (JP); Shoko Ono, Ichihara (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/562,072

(22) PCT Filed: Mar. 24, 2016

(86) PCT No.: PCT/JP2016/059482
§ 371 (c)(1),
(2) Date: Sep. 27, 2017

(87) PCT Pub. No.: WO2016/158697
PCT Pub. Date: Oct. 6, 2016

(65) Prior Publication Data
US 2018/0076047 A1    Mar. 15, 2018

(30) Foreign Application Priority Data
Mar. 30, 2015    (JP) .................. 2015-069833

(51) Int. Cl.
*H01L 21/02*    (2006.01)
*H01L 21/3105*    (2006.01)
(Continued)

(52) U.S. Cl.
CPC .... *H01L 21/31051* (2013.01); *C08G 73/0206* (2013.01); *C09D 179/02* (2013.01);
(Continued)

(58) Field of Classification Search
CPC ........ H01L 21/31051; H01L 21/02282; H01L 21/31058; H01L 21/02362;
(Continued)

(56) References Cited

U.S. PATENT DOCUMENTS 5,986,330 A * 11/1999 Kalnitsky ......... H01L 21/02126
257/634
6,333,274 B2 * 12/2001 Akatsu ............. H01L 21/31111
257/E21.251
(Continued)

FOREIGN PATENT DOCUMENTS

| JP | 11-150179 A | 6/1999 |
| JP | 2003-21827 A | 1/2003 |

(Continued)

OTHER PUBLICATIONS

International Search Report (PCT/ISA/210) dated Jun. 14, 2016, by the Japanese Patent Office as the International Searching Authority for International Application No. PCT/JP2016/059482.
(Continued)

*Primary Examiner* — Joseph C Nicely
*Assistant Examiner* — Pavel Ivanov
(74) *Attorney, Agent, or Firm* — Buchanan, Ingersoll & Rooney PC

(57) ABSTRACT

A method for manufacturing a filling planarization film, the method including: a first coating step of applying a first coating liquid, containing a polyamine and a first solvent, to a region including a recessed part of a member having the recessed part, to fill the first coating liquid into the recessed part; and a second coating step of applying a second coating liquid, containing an organic substance having two or more carboxyl groups and a second solvent having a boiling point of 200° C. or less and an SP value of 30 $(MPa)^{1/2}$ or less, to
(Continued)

the region including the recessed part of the member into which the first coating liquid has been filled.

9 Claims, 6 Drawing Sheets

(51) Int. Cl.
    *C08G 73/02*     (2006.01)
    *C09D 179/02*     (2006.01)
    *H01L 21/311*     (2006.01)

(52) U.S. Cl.
    CPC .. *H01L 21/02118* (2013.01); *H01L 21/02282* (2013.01); *H01L 21/02343* (2013.01); *H01L 21/02362* (2013.01); *H01L 21/31058* (2013.01); *H01L 21/31133* (2013.01)

(58) Field of Classification Search
    CPC ......... H01L 21/02343; H01L 21/02118; H01L 21/31133; C09D 179/02; C08G 73/0206
    See application file for complete search history.

(56) References Cited

U.S. PATENT DOCUMENTS

| | | |
|---|---|---|
| 2003/0012869 A1 | 1/2003 | Kido |
| 2003/0125869 A1 | 1/2003 | Kido |
| 2003/0146416 A1* | 8/2003 | Takei ..................... C08L 25/18 |
| | | 252/500 |
| 2007/0232077 A1 | 10/2007 | Setta et al. |
| 2015/0187670 A1 | 7/2015 | Ono et al. |

FOREIGN PATENT DOCUMENTS

| | | |
|---|---|---|
| JP | 2007-266264 A | 10/2007 |
| JP | 2011-82236 A | 4/2011 |
| WO | WO 2014/013956 A1 | 1/2014 |

OTHER PUBLICATIONS

Written Opinion (PCT/ISA/237) dated Jun. 14, 2016, by the Japanese Patent Office as the International Searching Authority for International Application No. PCT/JP2016/059482.

* cited by examiner

METHOD FOR MANUFACTURING FILLING PLANARIZATION FILM AND METHOD FOR MANUFACTURING ELECTRONIC DEVICE

TECHNICAL FIELD

The present invention relates to a method for manufacturing a filling planarization film and a method for manufacturing an electronic device.

BACKGROUND ART

In each of technical fields such as electronic devices (semiconductor devices, circuit boards, etc.), a filling planarization film is formed on a member having a recessed part, so that a region including the recessed part of the member may be planarized.

For example, a method of forming an insulating film for filling a groove (filling planarization film) that is a double layer of insulating films, on an element isolation trench in a semiconductor substrate (member) having element isolation trenches (recessed parts), by a chemical vapor deposition method (CVD method) and a spin coating method is known (see, for example, Japanese Patent Application Laid-Open (JP-A) No. H11-150179).

DISCLOSURE OF INVENTION

Technical Problem

Incidentally, in the field of semiconductor devices in which micronization advances, the micronization of the element and the narrowing of gaps of the recessed part (narrowing of the width of the recessed part) have advanced year after year, and the aspect ratio of the recessed part existing in the semiconductor device (ratio of depth to width [depth/width]) tends to increase greatly. Therefore, in a filling planarization film formed by a vapor phase film deposition system such as CVD method, only the upper part of the recessed part is blocked, thus there is a tendency that the filling property (embeddability) into the recessed part deteriorates (that is, a tendency that it is difficult to fill the inside of the recessed part).

Thus, it is considered that a method for forming a filling planarization film by a coating system using a coating liquid is advantageous, in place of the vapor phase film deposition system.

The filling planarization film may be requested to have heat resistance (for example, resistance to heat treatment which may be applied after forming a filling planarization film).

The invention has been made in view of the above, and an object thereof is to achieve the following objects.

That is, an object of the invention is to provide a method for manufacturing a filling planarization film, which can form a filling planarization film having excellent filling property (embeddability) into the recessed part and excellent heat resistance.

An object of the invention is also to provide a method for manufacturing an electronic device using the method for manufacturing a filling planarization film.

Concrete means for solving the problems includes the following modes.

<1> A method for manufacturing a filling planarization film, the method including:

a first coating step of applying a first coating liquid, containing a polyamine and a first solvent, to a region including a recessed part of a member having the recessed part, to fill the first coating liquid into the recessed part; and a second coating step of applying a second coating liquid, containing an organic substance having two or more carboxyl groups and a second solvent having a boiling point of 200° C. or less and an SP value of 30 $(MPa)^{1/2}$ or less, to the region including the recessed part of the member into which the first coating liquid has been filled, to form a filling planarization film that planarizes the region including the recessed part of the member.

<2> The method for manufacturing a filling planarization film according to <1>, wherein the organic substance having carboxyl groups is a divalent or higher-valent carboxylic acid.

<3> The method for manufacturing a filling planarization film according to <1> or <2>, wherein a content of the polyamine in the first coating liquid is from 1.0% by mass to 20% by mass.

<4> The method for manufacturing a filling planarization film according to any one of <1> to <3>, wherein the first solvent has a boiling point of 200° C. or less and is hydrophilic.

<5> The method for manufacturing a filling planarization film according to any one of <1> to <4>, wherein the filling planarization film has an amide bond.

<6> The method for manufacturing a filling planarization film according to any one of <1> to <5>, wherein the recessed part has a width of 250 nm or less, and has a ratio of depth to width [depth/width] of 0.3 or more.

<7> The method for manufacturing a filling planarization film according to any one of the items <1> to <6>, wherein a content of a metal element in the filling planarization film per unit area is $5 \times 10^{10}$ atoms/cm² or less per one kind of the metal element.

<8> A method for manufacturing an electronic device, the method including a filling planarization film forming step of forming the filling planarization film, on a semiconductor substrate or circuit substrate, which is a member having the recessed part, by the method for manufacturing a filling planarization film according to any one of <1> to <7>.

<9> The method for manufacturing an electronic device according to <8>, further including a removing step of removing the filling planarization film.

Advantageous Effects of Invention

According to the present invention, a method for manufacturing a filling planarization film, which can form a filling planarization film having excellent filling property (embeddability) into the recessed part and excellent heat resistance is provided.

According to the present invention, a method for manufacturing an electronic device using the method for manufacturing a filling planarization film is provided.

DESCRIPTION OF EMBODIMENTS

Hereinafter, an embodiment of the invention (hereinafter, also referred to as "the embodiment") will be described.

In the present specification, the numerical range represented using "to" means a range including numerical values described before and after "to" as a lower limit value and an upper limit value.

In the specification, as to the term "step", not only an independent step, but also a step even when that cannot be clearly distinguished from other steps are contained in this term, as long as the intended purpose of the step can be achieved.

The "coating film" herein means a film in general obtained by applying a coating liquid. The concept of the "coating film" includes not only a film in the state after application of a coating liquid and before drying, but also a film in the state after application of a coating liquid and after drying, and a film in the state after application of a coating liquid and after heat treatment (for example, the soft baking described later, the hard baking described later, etc.).

The thickness of the film may be herein referred to as "film thickness".

The SP value herein refers to a Hansen solubility parameter, which is a value calculated by the following formula, according to Hansen Solubility Parameter A User's Handbook (edited by Charles M. Hansen, CRC Press; 1$^{st}$ Edition).

$$\delta = ((\delta D)^2 + (\delta P)^2 + (\delta H)^2)^{1/2}$$

wherein δ represents the SP value (i.e. Hansen solubility parameter), δD represents a dispersion term, δP represents a polar term, and δH represents a hydrogen bond term.

[Method for Manufacturing Filling Planarization Film]

The method for manufacturing a filling planarization film of the embodiment (hereinafter, also referred to as "the manufacturing method of the embodiment") includes a first coating step of applying a first coating liquid, containing a polyamine and a first solvent, to a region including a recessed part of a member having the recessed part, to fill the first coating liquid into the recessed part, and a second coating step of applying a second coating liquid, containing an organic substance having two or more carboxyl groups and a second solvent having a boiling point of 200° C. or less and an SP value of 30 $(MPa)^{1/2}$ or less, to the region including the recessed part of the member into which the first coating liquid has been filled, to form a filling planarization film that planarizes the region including the recessed part of the member.

The manufacturing method of the embodiment may have other steps, if necessary.

Examples of the other steps include known steps in a semiconductor process or a circuit board process.

In the embodiment, the filling planarization film refers to a film having a function in which at least a part of which is embedded (that is, filled) into the recessed part to planarize a region including the recessed part of the member having the recessed part.

Figure 1:
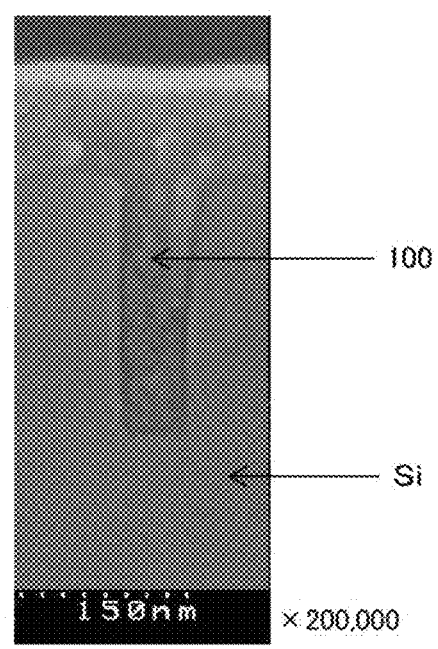
FIG. 1 is a scanning electron microscope (SEM) photograph (magnification of 200,000 times) showing a cross section of a recessed part (groove) into which a filling planarization film is filled, in Example 1.
Figure 3:
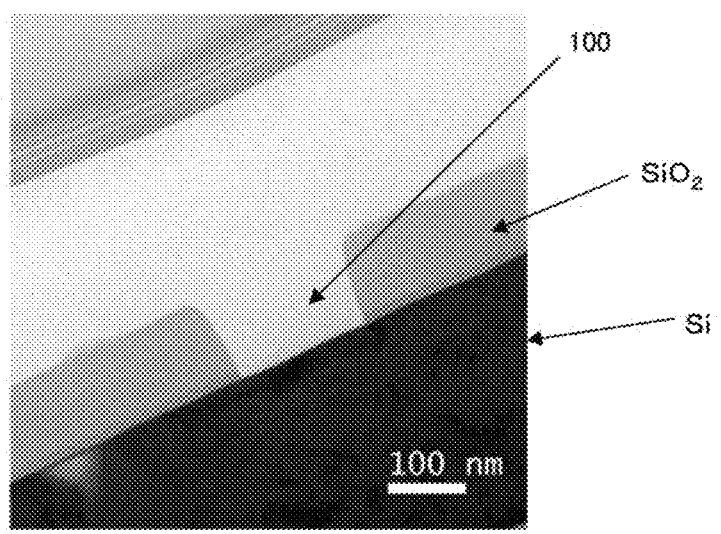
FIG. 3 is a transmission electron microscope (TEM) photograph (magnification of 100,000 times) showing a cross section of a recessed part (groove) into which a filling planarization film is filled, in Example 2.
Figure 4:
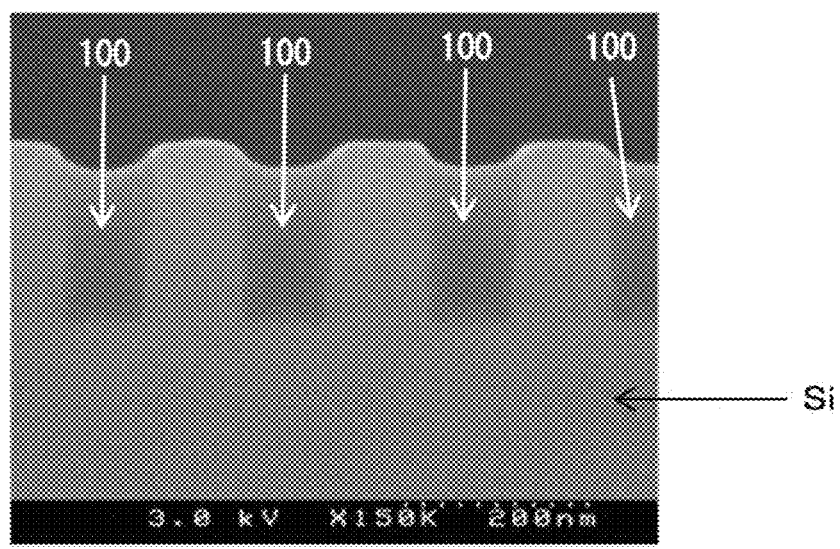
FIG. 4 is a scanning electron microscope (SEM) photograph (magnification of 150,000 times) showing a cross section of a recessed part (groove) into which a filling planarization film is filled, in Example 3.
Figure 5:
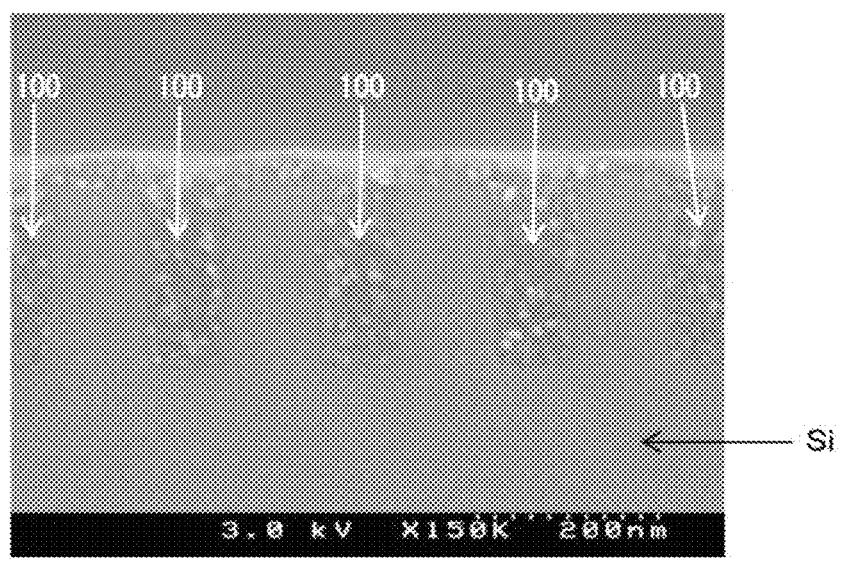
FIG. 5 is a scanning electron microscope (SEM) photograph (magnification: 150,000 times) showing a cross section of a recessed part (groove) into which a filling planarization film is filled, in Example 4.

The filling planarization film may be formed (filled) only inside the recessed part (see, for example, FIG. 4), or may be formed (filled) inside the recessed part and then formed protruded to the outside of the recessed part (above the recessed part and a flat part around the recessed part) (see, for example, FIGS. 1, 3 and 5).

According to the manufacturing method of the embodiment, it is possible to form a filling planarization film having excellent filling property (embeddability) into the recessed part and excellent heat resistance.

The reason why such effects are exhibited is considered as follows.

That is, in the manufacturing method of the embodiment, a filling planarization film is formed by sequentially applying a first coating liquid and a second coating liquid to the region including a recessed part of a member having the recessed part.

In the manufacturing method of the embodiment, it is considered that the first coating liquid is a liquid that easily reaches the bottom of the recessed part, and easily fills (that is, easily embeds) the recessed part, and that the second solvent in the second coating liquid is a solvent which hardly dissolves (elutes) the polyamine filled in the recessed part by application of the first coating liquid, that is, a solvent having a low SP value (specifically, 30 $(MPa)^{1/2}$ or less), whereby it is possible to form a filling planarization film having excellent filling property (embeddability) into the recessed part.

Furthermore, in the manufacturing method of the embodiment, it is considered that the polyamine in the first coating liquid and the organic substance having two or more carboxyl groups in the second coating liquid can react with each other in the inside of the recessed part of the member (preferably, at least one of an amide bond, an amide imide bond, or an imide bond is formed by an amino group of the polyamine, and the carboxyl group of the organic substance) to form a filling planarization film having excellent heat resistance.

With regard to the second coating step, more specifically, since the second solvent having an SP value of 30 $(MPa)^{1/2}$ or less is contained in the second coating liquid, thus, in the second coating step, a phenomenon that the polyamine dissolves into the second coating liquid (second solvent) and a phenomenon that the filling property into the recessed part deteriorates due to such phenomenon are suppressed. Therefore, in the second coating step, the organic substance having two or more carboxyl groups easily permeates to the bottom of the recessed part, and the permeated organic substance efficiently reacts with the polyamine existing inside the recessed part. It is thus considered that a filling planarization film having excellent filling property into the recessed part and excellent heat resistance can be formed.

From the above reasons, it is considered that, according to the manufacturing method of the embodiment, a filling planarization film having excellent filling property (embeddability) into the recessed part and excellent heat resistance can be formed.

As described above, the embodiment has been performed by paying attention to the point that the polyamine is easily dissolved in a solvent having an SP value of more than 30 $(MPa)^{1/2}$ (for example, water), and has been completed as a means for suppressing deterioration of the filling property into the recessed part due to dissolution of the polyamine.

Furthermore, the embodiment has been completed by finding that a film having excellent heat resistance is obtained by a reaction between a polyamine and an organic substance having two or more carboxyl groups.

The manufacturing method of the embodiment also has an advantage that the second solvent hardly remains in the filling planarization film (for example, is easily removed from the coating film by evaporation) since the boiling point of the second solvent is 200° C. or less.

Furthermore, as described above, the filling planarization film produced by the manufacturing method of the embodiment is a film obtained by a reaction of a polyamine and an organic substance having two or more carboxyl groups in the second coating liquid (preferably, a film having an amide bond), thus is also excellent in resistance to plasma (hereinafter, also referred to as "plasma resistance") which may be irradiated after forming the filling planarization film.

Examples of the plasma referred herein include plasma generated from at least one gas selected from the group consisting of helium gas, argon gas, nitrogen gas, ammonia gas, and fluorocarbon gas.

Incidentally, a polyimide film is widely known as the film having excellent heat resistance.

However, as a result of study by the inventors, it has been found that a polyimide film easily shrinks after application, thus, in a case in which a polyimide film is used as the filling planarization film, the filling property into the recessed part tends to deteriorate. Furthermore, in a case in which a polyimide film is used as the filling planarization film, pattern deviation occurs due to shrinkage, so the margin of designed dimension must be enlarged. Therefore, a narrow pitch design of electronic devices (semiconductor devices, etc.) is also difficult.

Regarding these problems, according to the manufacturing method of the embodiment, it is possible to form a filling planarization film having excellent filling property into the recessed part, as compared with the method of forming a polyimide film as the filling planarization film. Thus, the margin of designed dimension can be reduced, and the narrow pitch design of electronic devices (semiconductor devices, etc.) is also facilitated.

In the manufacturing method of the embodiment, the organic substance having two or more carboxyl groups contained in the second coating liquid is preferably a divalent or higher valent carboxylic acid. This further improves the heat resistance of the filling planarization film. When the organic substance having two or more carboxyl groups is a divalent or higher-valent carboxylic acid, the heat resistant temperature of the filling planarization film can be set to, for example, 350° C. or more. When the organic substance having two or more carboxyl groups is a divalent or higher-valent carboxylic acid, the plasma resistance of the filling planarization film is also further improved.

From the viewpoint of further improving the heat resistance of the filling planarization film, the organic substance having two or more carboxyl groups contained in the second coating liquid is preferably a trivalent or higher-valent carboxylic acid. When the organic substance having two or more carboxyl groups is a trivalent or higher-valent carboxylic acid, the heat resistant temperature of the filling planarization film can be set to, for example, 400° C. or more.

Furthermore, when the organic substance having two or more carboxyl groups is a trivalent or higher-valent carboxylic acid, the plasma resistance of the filling planarization film is further improved. When the organic substance having two or more carboxyl groups is a trivalent or higher-valent carboxylic acid, for example, it is possible to suppress the etching rate of the filling planarization film to a plasma generated from at least one gas selected from the group consisting of helium gas, argon gas, nitrogen gas, ammonia gas, and fluorocarbon gas, to be equal to or less than the etching rate of the $SiO_2$ film to the plasma.

In the manufacturing method of the embodiment, the first solvent is preferably a solvent having a boiling point of 200° C. or less and being hydrophilic.

When the boiling point of the first solvent is 200° C. or less, the effect that the first solvent hardly remains in the filling planarization film (for example, is easily removed from the coating film by evaporation) is exhibited.

In addition, when the first solvent is hydrophilic, the solubility of the polyamine in the first solvent is further improved, and consequently, the stability of the first coating liquid is further improved.

In the manufacturing method of the embodiment, the filling planarization film preferably has an amide bond. By having an amide bond, it becomes possible to finally three-dimensionally crosslink the polyamine. This further improves the heat resistance of the filling planarization film.

In a case in which the filling planarization film has an amide bond, the filling planarization film may have at least one of an imide bond or an amide imide bond, in addition to the amide bond.

In the manufacturing method of the embodiment, a mode in which the recessed part has a width of 250 nm or less (preferably 200 nm or less, and more preferably 100 nm or less), and has a ratio of depth to width [depth/width] (hereinafter, also referred to as "aspect ratio") of 0.3 or more (preferably 0.5 or more) is preferable.

Generally speaking, the recessed part (that is, the recessed part having a narrow width and a large aspect ratio) of the above mode is a recessed part that tends to be difficult to fill the filling planarization film.

However, in the manufacturing method of the embodiment, since the filling planarization film is formed using the liquids (the first coating liquid and the second coating liquid), a filling planarization film having excellent filling property (embeddability) can be formed, also in the recessed part of the above mode.

In other words, in the case of forming the filling planarization film in the recessed part of the above mode, the effect of the filling property (embeddability) according to the embodiment is particularly effectively exhibited.

In the manufacturing method of the embodiment, the heat resistant temperature of the filling planarization film is preferably 350° C. or more, from the viewpoint of heat resistance.

The heat resistant temperature herein refers to a temperature of heat treatment at which the film thickness of the film heat-treated for 30 minutes to the film thickness of the film heat-treated for 10 minutes ("Residual film rate after heat treatment for 30 minutes" represented by the following Formula (1)) is 30% or more.

Residual film rate (%) after heat treatment for 30 minutes=(Film thickness of film heat-treated for 30 minutes/Film thickness of film heat-treated for 10 minutes)×100        Formula (1)

The film thickness of the filling planarization film can be measured by observing the cross section of the recessed part. In order to evaluate the heat resistance of the material itself or residual film rate of the filling planarization film, or whether or not a film can be formed, a film is formed in the first coating step and the second coating step using a flat substrate, and the film thickness thereof may be measured.

In a case in which a flat substrate is used, the film thickness can be measured using an ellipsometer.

Further, in the manufacturing method of the embodiment, it is preferable that the filling planarization film does not generate a void when heated at 350° C. or more for 30 minutes, from the viewpoint of heat resistance.

Here, the void refers to a gap in the filling planarization film filled in the recessed part (that is, a gap part in which the filling planarization film is not filled in the recessed part).

In the manufacturing method according to the embodiment, from the viewpoint of conforming to the standards to be carried into the semiconductor process step, it is preferable that the content of the metal element in the filling planarization film per unit area is $5 \times 10^{10}$ atoms/cm$^2$ or less per one kind of the metal element.

Here, in the range of the filling planarization film of the mode in which "the content of the metal element in the filling planarization film per unit area is $5 \times 10^{10}$ atoms/cm$^2$ or less per one kind of the metal element", a filling planarization film which contains no metal atom, a filling planarization film which contains only one kind of a metal element, and in which the content of the metal element is $5 \times 10^{10}$ atoms/cm$^2$ or less, and a filling planarization film which contains two or more kinds of metal elements, and in which the content of each metal element is $5 \times 10^{10}$ atoms/cm$^2$ or less (for example, the content of Fe is $5 \times 10^{10}$ atoms/cm$^2$, the content of Cu is $5 \times 10^{10}$ atoms/cm$^2$, the content of Al is $5 \times 10^{10}$ atoms/cm$^2$, the content of Sn is $5 \times 10^{10}$ atoms/cm$^2$, and the content of Ti is $5 \times 10^{10}$ atoms/cm$^2$) are all included.

The metal element content of the surface of the filling planarization film is measured by Total Reflection X-ray Fluorescence analysis (TXRF). Total reflection X-ray fluorescence is usually used for metal content measurement. In the metal content measurement, a member having a recessed part provided with a filling planarization film is measured, and besides, the metal content may be measured, using a film formed on a flat substrate such as a silicon wafer.

A filling planarization film in a mode in which the content of the metal element in the filling planarization film per unit area is $5 \times 10^{10}$ atoms/cm$^2$ or less per one kind of the metal element is particularly suitable as a film to be removed by UV ozone treatment or plasma treatment (that is, a sacrificial film). This is because the metal element may remain in the UV ozone treatment and plasma treatment when the sacrificial film is removed, which may cause contamination.

The filling planarization film in the embodiment may be formed (filled) only inside the recessed part, or may be formed (filled) inside the recessed part and then formed protruded to the outside of the recessed part (above the recessed part, and a flat part around the recessed part).

In a case in which the filling planarization film is formed protruded to the outside of the recessed part, the upper limit of the thickness of the filling planarization film in the outside of the recessed part (above the recessed part, and a flat part around the recessed part) is not particularly limited. However, the upper limit can be, for example, 100 nm, and is preferably 50 nm, and still more preferably 10 nm.

Each step of the manufacturing method of the embodiment will be described below.

<First Coating Step>

The first coating step is a step of applying a first coating liquid, containing a polyamine and a first solvent, to a region including a recessed part of a member having the recessed part, to fill the first coating liquid into the recessed part.

The first coating step may include a heat treatment stage of heat-treating the applied first coating liquid, and the like, in addition to the coating stage of applying the first coating liquid, a drying stage of drying the applied first coating liquid.

(Member Having Recessed Part)

The member having a recessed part is a member to be formed with a filling planarization film.

Examples of the "member" in the member having a recessed part include semiconductor substrates (or semiconductor devices) such as silicon wafers, circuit substrates (for example, printed wiring boards), and the like.

The recessed part may be a groove (for example, trench) or a hole (for example, via).

More specifically, examples of the recessed part include recessed parts formed by etching the member (for example, element isolation trench, via, etc.), recessed parts decided by the side of a plurality of conductive parts (for example, electrode or wiring made of a metal such as Cu) provided on the member and the surface of the member, and the like.

A preferable range of the width and aspect ratio of the recessed part is as described above.

(First Coating Liquid)

The first coating liquid is a liquid containing a polyamine and a first solvent.

The pH (25° C.) of the first coating liquid is preferably from 4.0 to 11.0, more preferably from 6.0 to 11.0, and still more preferably from 6.0 to 9.0.

—First Solvent—

The first solvent contained in the first coating liquid is not particularly limited, and may be a single solvent or a mixed solvent. The first solvent is preferably a solvent different from a second solvent.

As described above, the first solvent is preferably a solvent having a boiling point of 200° C. or less and being hydrophilic.

Examples of the first solvent include water, water-soluble organic solvents having a boiling point of 200° C. or less (for example, alcohols such as methanol and ethanol), and the like.

When the boiling point of the first solvent is 200° C. or less, as described above, the first solvent hardly remains in the filling planarization film. For example, the first solvent is easily evaporated and removed from the coating film during the first coating step (for example, during rotation by a spin coater).

The boiling point of the first solvent is preferably from 50° C. to 200° C., and more preferably from 60° C. to 140° C.

When the boiling point of the first solvent is 50° C. or more, the first coating liquid is excellent in handleability. For example, in a case in which a coating apparatus (for example, a spin coater) equipped with a nozzle is used, nozzle clogging is suppressed.

When the first solvent is hydrophilic, the solubility of the polyamine is improved, and the stability of the first coating liquid is improved, as described above.

Therefore, the first solvent is preferably a hydrophilic solvent.

Here, the hydrophilic solvent refers to a solvent having a high SP value.

More specifically, the SP value of the first solvent is preferably 24 $(MPa)^{1/2}$ or more, more preferably 26 $(MPa)^{1/2}$ or more, and still more preferably more than 30 $(MPa)^{1/2}$.

The upper limit of the SP value of the first solvent is not particularly limited, and the upper limit is, for example, 50 $(MPa)^{1/2}$.

In a case in which the first solvent is a mixed solvent comprising a plurality of solvent types, the SP value of the first solvent is obtained by proportional distribution calculation, based on the SP value and molar fraction of each solvent type (R. F. Fedors Polym. Eng. Sci., 14, 147 (1974)).

As the first solvent, water, an alcohol (preferably at least one of methanol or ethanol), or a mixed solvent of water and an alcohol (preferably at least one of methanol or ethanol) is preferable.

The first solvent preferably contains water.

—Polyamine—

The polyamine contained in the first coating liquid refers to an aliphatic hydrocarbon compound (preferably a polymer compound) having two or more amino groups.

The molecular weight of the polyamine is not particularly limited, and the weight-average molecular weight of the polyamine is preferably from 2,000 to 1,000,000, more preferably from 2,000 to 600,000, still more preferably from 10,000 to 200,000, still more preferably from 20,000 to 200,000, and still more preferably from 20,000 to 150,000.

The weight-average molecular weight and molecular weight distribution herein refer to a weight-average molecular weight and molecular weight distribution measured in terms of polyethylene glycol, as measured by GPC (Gel Permeation Chromatography) method.

The weight-average molecular weight and the molecular weight distribution are measured using an aqueous solution having an acetic acid concentration of 0.5 mol/L and a sodium nitrate concentration of 0.1 mol/L as a developing solvent, using an analyzer Shodex GPC-101 and a column Asahipak GF-7 MHQ, and calculated using polyethylene glycol as a standard.

The polyamine preferably contains a repeating unit structure having at least one of an amino group, a quaternary ammonium group, or an imino group.

In a case in which the polyamine contains the repeating unit structure, the repeating unit structure contained in the polyamine may be of one kind or of two or more kinds.

The repeating unit structure preferably has a molecular weight of from 30 to 500.

In a case in which the polyamine contains the repeating unit structure, the total content of the amino group, the quaternary ammonium group and the imino group is preferably from 10 to 2,500 per weight-average molecular weight of the polyamine.

As a matter of course, "the total content of the amino group, the quaternary ammonium group and the imino group" refers to the content of the amino group in a case in which the polyamine contains "a repeating unit structure having an amino group and not having a quaternary ammonium group and an imino group".

Examples of the polyamine include polyalkyleneimine (for example, polyalkyleneimine which is a polymer of alkyleneimine having 2 to 12 carbon atoms (preferably 2 to 8 carbon atoms, and more preferably 2 to 4 carbon atoms), particularly preferably polyethyleneimine (PEI)), polyallylamine (PAA), polydiallyl dimethyl ammonium (PDDA), polylysine, and derivatives thereof.

Among these, preferred is polyalkyleneimine (for example, polyalkyleneimine which is a polymer of alkyleneimine having 2 to 12 carbon atoms (preferably 2 to 8 carbon atoms, and more preferably 2 to 4 carbon atoms) or a derivative thereof, and particularly preferred is polyethyleneimine (PEI)) or a derivative thereof.

The polyamine may be used by selecting the polymer that falls under polyamine from "a resin having two or more cationic functional groups and a weight-average molecular weight of from 2,000 to 100,000" described in International Publication No. 2010/137711, "a polymer that includes two or more cationic functional groups including at least one of a tertiary nitrogen atom or a quaternary nitrogen atom, that has a weight average molecular weight of from 2,000 to 1,000,000, and that has a branching degree of 48% or more" described in International Publication No. 2013/108791A, and "a polymer having a cationic functional group and a weight average molecular weight of from 2,000 to 1,000, 000" described in International Publication No. 2014/013956, if appropriate.

The first coating liquid may contain only one kind of polyamine or two or more kinds of polyamines.

The content of polyamine in the first coating liquid (the total content in the case of two or more kinds thereof. The same shall apply hereinafter.) is not particularly limited, and it is preferably 1.0% by mass or more, more preferably 1.5% by mass or more, and still more preferably 2.0 mass % or more, with respect to the total amount of the first coating liquid, from the viewpoint of forming a thicker coating film and further improving the filling property into the recessed part.

The upper limit of the polyamine content in the first coating liquid is also not particularly limited. However, from the viewpoint of further improving the filling property into the inside of the recessed part by reducing the viscosity of the first coating liquid, the content of the polyamine in the first coating liquid can be, for example, 20% by mass or less, and is preferably 15% by mass or less, and more preferably 10% by mass or less, with respect to the total amount of the first coating liquid.

The first coating liquid may contain other components except the polyamine and the first solvent.

The other components that can be contained in the first coating liquid is preferably at least one selected from the group consisting of compounds having a boiling point of 210° C. or less (preferably 160° C. or less) and compounds having no decomposability even when heat-treated to 250° C.

The "compounds having no decomposability even when heat-treated to 250° C." refer to a compound where the change in mass after holding at 250° C. for 1 hour under nitrogen, with respect to the mass measured at 25° C., is less than 50%.

Also, an acid may be added to the first coating liquid, for the purpose of pH adjustment. However, acids that are aggregated or insolubilized by the crosslinking reaction of polyamine, for example, divalent or higher acids (that is, acids having a crosslinking point) are not suitable.

On the other hand, monovalent carboxylic acid compounds such as formic acid, acetic acid and benzoic acid are suitable acids. In particular, it is expected that a monovalent aromatic carboxylic acid having a small molecular weight binds also to an amine at a site where a divalent or higher-valent carboxylic acid is hard to react, can reduce unbound amine, can reduce the water adsorption amount, and consequently can improve film physical properties.

(Method of Applying First Coating Liquid)

The application method of the first coating liquid is not particularly limited, and a commonly used method can be used.

Examples of the application method include a spin coating method, a slit coating method, a dipping method, a spray method, and the like, and a spin coating method is particularly preferable. Application by the spin coating method can be carried out using a spin coater as a coating apparatus.

(Coating Film of First Coating Liquid)

The film thickness (coating film thickness) of the coating film of the first coating liquid is not particularly limited, and is preferably a thickness at which the recessed part is filled, according to the depth of the recessed part, and is preferably, for example, from 20 nm to 1000 nm.

In the case of performing the heat treatment (for example, soft bake) described later in the first coating step, it is preferable to increase the film thickness before the heat treatment, in consideration of the volume shrinkage in the heat treatment.

The film thickness before the heat treatment is preferably from 100 nm to 1000 nm although it depends on the depth of the recessed part.

(Heat Treatment)

The first coating step may include a heat treatment stage of heat-treating the first coating liquid applied to the member, in addition to the coating stage of applying the first coating liquid.

When the first coating step includes the heat treatment stage, dissolution of polyamine in the second coating liquid can be further reduced, and polyamine is more easily remained inside the recessed part, in the second coating step.

The heat treatment in the heat treatment stage is preferably a treatment of heating the member coated with the first coating liquid under a condition of a temperature of 70° C. or more and lower than 200° C. (hereinafter, also referred to as "soft bake").

When the temperature is 70° C. or more, polyamine more easily remains inside the recessed part, in the second coating step. Furthermore, the evaporation removability of the first solvent from the coating film of the first coating liquid is also further improved.

When the temperature is less than 200° C., the subsequent cooling of the member can be performed more quickly, so that the next step (second coating step) can be performed more quickly.

The temperature is more preferably from 85° C. to 150° C., and still more preferably from 90° C. to 125° C.

The fact that the temperature of the heat treatment is low is also advantageous in that a simple device such as a hot plate can be used as an apparatus for heat treatment.

The atmosphere in which the heat treatment (for example, soft bake) is performed is not particularly limited, and may be, for example, an atmospheric atmosphere or an atmosphere of an inert gas (nitrogen gas, argon gas, helium gas, etc.).

The time of the heat treatment (for example, soft bake) is also not particularly limited, and is preferably 300 seconds or less, more preferably 200 seconds or less, still more preferably 120 seconds or less, and particularly preferably 80 seconds or less.

The lower limit of the heating time is not particularly limited, and the lower limit can be, for example, 10 seconds (preferably 20 seconds, and more preferably 30 seconds).

<Second Coating Step>

The second coating step is a step of applying a second coating liquid containing an organic substance having two or more carboxyl groups and a second solvent having a boiling point of 200° C. or less and an SP value of 30 $(MPa)^{1/2}$ or less to the region including the recessed part of the member into which the first coating liquid has been filled, to form a filling planarization film that planarizes the region including the recessed part of the member.

The preferable properties (heat resistant temperature, content of metal element, thickness, etc.) of the filling planarization film to be formed are as described above.

At this time, preferably, the amino group of the polyamine in the first coating liquid reacts with the carboxyl group of the organic substance having two or more carboxyl groups in the second coating liquid to form at least one of an amide bond, an amide imide bond or an imide bond, and thus, a filling planarization film having at least one of an amide bond, an amide imide bond or an imide bond is formed.

There is no particular restriction on the method of applying the second coating liquid, and a commonly used method can be used. Examples of the method of applying the second coating liquid include methods similar to the method exemplified as the method of applying the first coating liquid (for example, a spin coating method).

The second coating step may also include, as the first coating step, a drying stage of drying the applied second coating liquid, a heat treatment stage of heat-treating the applied second coating liquid, and the like, in addition to the coating stage of applying the second coating liquid.

(Second Coating Liquid)

The second coating liquid includes an organic substance having two or more carboxyl groups and a second solvent having a boiling point of 200° C. or less and an SP value of 30 $(MPa)^{1/2}$ or less.

—Second Solvent—

The second solvent is a solvent having a boiling point of 200° C. or less and an SP value of 30 $(MPa)^{1/2}$ or less.

The second solvent may be a single solvent or a mixed solvent.

When the boiling point of the second solvent is 200° C. or less, as described above, the second solvent hardly remains in the filling planarization film. When the boiling point of the second solvent is 200° C. or less, for example, the second solvent is easily evaporated and removed from the coating film during the second coating step (for example, during rotation by a spin coater).

The boiling point of the second solvent is preferably from 50° C. to 200° C., and more preferably from 60° C. to 140° C.

When the boiling point of the second solvent is 50° C. or more, the second coating liquid is excellent in handleability. For example, in a case in which a coating apparatus (for example, a spin coater) equipped with a nozzle is used, nozzle clogging is suppressed.

The SP value of the second solvent is 30 $(MPa)^{1/2}$ or less. This suppresses a phenomenon in which the polyamine existing inside the recessed part is dissolved in the second solvent, during the second coating step. Therefore, when the SP value of the second solvent is 30 $(MPa)^{1/2}$ or less, the filling property of the filling planarization film into the recessed part is improved.

The SP value of the second solvent is 30 $(MPa)^{1/2}$ or less as described above, and is more preferably 24 $(MPa)^{1/2}$ or less, from the viewpoint of further suppressing the dissolution of the polyamine, and further improving the filling property of the filling planarization film into the recessed part.

The lower limit of the SP value of the second solvent is not particularly limited, and the lower limit is, for example, 15 $(MPa)^{1/2}$.

Examples of the second solvent include cyclohexane, propylene glycol monomethyl ether acetate (PGMEA), toluene, cyclopentanone, dimethylacetamide (DMAc), 2-butanol (2-BtOH), 1-butanol (1-BtOH), isopropyl alcohol (IPA), dimethylformamide (DMF), 1-propanol (1-PrOH), ethanol (EtOH), methanol (MeOH), and the like.

Boiling points (bp), log (Pow) and SP values for each of these solvents were shown in Table 3 below.

Further, the second solvent is preferably a solvent having a high solubility of an organic substance having two or more carboxyl groups. This improves the stability of the second coating liquid.

As the second solvent having a high solubility of an organic substance having two or more carboxyl groups, more specifically, a solvent having an octanol/water partition coefficient log (Pow) of 1.0 or less is preferable, and a solvent having log (Pow) of 0.6 or less is still more preferable.

As the second solvent, a solvent having an SP value of 24 $(MPa)^{1/2}$ or less, a boiling point of from 60° C. to 140° C., and a log (Pow) of 0.6 or less is particularly preferable.

As the second solvent, propylene glycol monomethyl ether acetate (PGMEA), cyclopentanone, dimethylacetamide (DMAc), isopropyl alcohol (IPA), dimethylformamide (DMF), 1-propanol (1-PrOH), and ethanol (EtOH) are still more preferable, and cyclopentanone, isopropyl alcohol (IPA), 1-propanol (1-PrOH) or ethanol (EtOH) is particularly preferable, from the viewpoint of boiling point, SP value and log (Pow).

In a case in which the second solvent is a mixed solvent comprising a plurality of solvent types, the SP value of the second solvent is obtained by proportional distribution calculation, based on the SP value and molar fraction of each solvent type.

In a case in which the second solvent is a mixed solvent comprising a plurality of solvent types, log (Pow) of the second solvent is obtained by proportional distribution calculation, based on log (Pow) and molar fraction of each solvent type.

—Organic Substance Having Two or More Carboxyl Groups—

The second coating liquid contains an organic substance having two or more carboxyl groups.

The organic substance having two or more carboxyl groups is preferably a carboxylic acid.

Examples of the carboxylic acid include divalent carboxylic acids such as oxalic acid, malonic acid, succinic acid, glutaric acid, adipic acid, pimelic acid, maleic acid, fumaric acid, phthalic acid, isophthalic acid and terephthalic acid; trivalent carboxylic acids such as 1,2,3-propane tricarboxylic acid, trimesic acid, trimellitic acid, and citric acid; tetravalent carboxylic acids such as pyromellitic acid, ethylenediaminetetraacetic acid, naphthalenetetracarboxylic acid, biphenyltetracarboxylic acid, benzophenonetetracarboxylic acid, bicyclo[2.2.2]oct-7-ene-2,3,5,6-tetracarboxylic acid and meso-butane-1,2,3,4-tetracarboxylic acid; hexavalent carboxylic acids such as benzenehexacarboxylic acid and cyclohexanehexacarboxylic acid; oxymonocarboxylic acids such as hydroxybutyric acid, lactic acid and salicylic acid; oxydicarboxylic acids such as malic acid and tartaric acid; oxytricarboxylic acids such as citric acid; and aminocarboxylic acids such as aspartic acid and glutamic acid; and the like.

There is no particular limitation on the molecular weight of the organic substance having two or more carboxyl groups, and the molecular weight is, for example, from 90 to 1000, preferably from 90 to 342, and more preferably from 90 to 210.

The organic substance having two or more carboxyl groups is preferably a divalent or higher-valent carboxylic acid, from the viewpoint of heat resistance and plasma resistance of the filling planarization film, as described above.

Here, the concept of the divalent or higher-valent carboxylic acid also includes carboxylic acids in which at least part of a plurality of carboxyl groups is dehydrated (for example, phthalic anhydride).

From the viewpoint of further improving the heat resistance and plasma resistance of the filling planarization film, the organic substance having two or more carboxyl groups is preferably a trivalent or higher-valent carboxylic acid.

The upper limit of the valence of the carboxylic acid is not particularly limited, and from the viewpoint of removability when removing the filling planarization film, the valence of the carboxylic acid is preferably hexavalent or less, and more preferably tetravalent or less.

The second coating liquid may contain only one kind or two or more kinds of organic substances having two or more carboxyl groups.

The content of the organic substance having two or more carboxyl groups in the second coating liquid (the total content in the case of two or more kinds thereof. The same shall apply hereinafter.) is not particularly limited, and is preferably 0.5% by mass or more, and more preferably 1.0% by mass or more, with respect to the total amount of the second coating liquid, from the viewpoint of further improving the heat resistance of the filling planarization film.

The upper limit of the organic substance having two or more carboxyl groups in the second coating liquid is also not particularly limited, and the content can be, for example, 10% by mass or less, and is preferably 5.0% by mass or less, with respect to the total amount of the second coating liquid.

The second coating liquid may contain other components other than the second solvent and the organic substance having two or more carboxyl groups.

The other components that can be contained in the second coating liquid is preferably at least one selected from the group consisting of compounds having a boiling point of 210° C. or less (preferably 160° C. or less) and compounds having no decomposability even when heat-treated to 250° C.

(Heat Treatment)

The second coating step may include a heat treatment stage of heat-treating a member coated with the second coating liquid, in addition to the coating step of applying the second coating liquid.

When the second coating step includes the heat treatment stage, an amide bond can be more effectively formed by the reaction between the polyamine and the organic substance having two or more carboxyl groups, and consequently, the heat resistance of the filling planarization film can be further improved.

The heat treatment in the heat treatment stage is preferably a treatment of heating the member coated with the second coating liquid under a condition of a temperature of from 200° C. to 425° C. (hereinafter, also referred to as "hard bake").

When the temperature of the heat treatment is 200° C. or more, at least one of an amide bond, an amide imide bond or an imide bond can be more effectively formed, and the heat resistance of the filling planarization film can be further improved.

When the temperature of the heat treatment is 425° C. or less, the heat treatment is more easily performed. For example, the heat treatment can be performed using a simpler device. In a case in which a member having a recessed part has a member containing a metal such as copper (Cu) (for example, wiring, electrode), when the temperature is 425° C. or less, migration of the member containing a metal can be suppressed.

The temperature of the heat treatment is preferably from 250° C. to 400° C., and more preferably from 300° C. to 400° C.

The pressure of the atmosphere in which the heat treatment is performed is not particularly limited, and is preferably an absolute pressure of more than 17 Pa and equal to or less than the atmospheric pressure.

The absolute pressure is more preferably 1000 Pa or more and equal to or less than the atmospheric pressure, still more preferably 5000 Pa or more and equal to or less than the atmospheric pressure, and particularly preferably 10000 Pa or more and equal to or less than the atmospheric pressure.

The heat treatment can be performed by a usual method using a furnace or a hot plate. As the furnace, for example, ACT12SOD manufactured by Tokyo Electron Limited, SPX-1120 manufactured by Apex Corporation, or VF-1000LP manufactured by Koyo Thermo Systems Co., Ltd. can be used.

The heat treatment may be performed in an air atmosphere, or in an atmosphere of an inert gas (nitrogen gas, argon gas, helium gas, etc.).

The time of the heat treatment is not particularly limited, and is, for example, 1 hour or less, preferably 30 minutes or less, and more preferably 10 minutes or less. The lower limit of the time of the heat treatment is not particularly limited, and can be, for example, 0.1 minutes.

In the second coating step, both soft bake and hard bake may be performed as the heat treatment.

Experimental Example 1

As Experimental Example 1, an experiment concerning the relationship between the kind of the organic substance having two or more carboxyl groups in a second coating liquid and heat resistance of the coating film was conducted (Table 1 below).

(First Coating Step)

As the first coating liquid, a polyethyleneimine (PEI) coating liquid (polyethyleneimine (brand name: Rupasol WF (manufactured by BASF), weight-average molecular weight (Mw) of PEI: 25000), first solvent: water, PEI content: 4% by mass, pH=10.5) was prepared. PEI was used after removing metal and halogen.

1 mL of the first coating liquid was discharged onto the surface of a flat silicon wafer substrate placed on a spin coater (manufactured by ABLECo. Ltd.) using a pipette, then the flat silicon wafer substrate was rotated at a rotation speed of 1000 rpm for 1 second, and further rotated at a rotation speed of 600 rpm for 60 seconds to obtain a dry coating film. The obtained dry coating film was soft-baked in the air at 100° C. for 1 minute on a hot plate (SPX-1120 manufactured by Apex Corporation) to obtain a coating film (after soft baking).

(Second Coating Step)

Terephthalic acid (98%, manufactured by Aldrich) and phthalic acid (99.9%, manufactured by Aldrich) were prepared as the organic substance having two or more carboxyl groups in the second coating liquid. As a carboxylic acid for comparison, acetic acid (99.7%, manufactured by Aldrich) that is a monovalent carboxylic acid was prepared. As the second solvent, isopropyl alcohol (IPA; SC grade manufactured by Wako Pure Chemical Industries, Ltd.) was prepared. Using these materials, a terephthalic acid coating liquid (terephthalic acid concentration: 0.1% by mass), a phthalic acid coating liquid (phthalic acid concentration: 2% by mass), and an acetic acid coating liquid (acetic acid concentration: 3% by mass) were respectively prepared as the second coating liquid. The acetic acid coating liquid is a second coating liquid for comparison.

1 mL of the second coating liquid was discharged onto the coating film obtained in the first coating step (after soft baking), and the coating film was rotated at a rotation speed of 1000 rpm for 1 second by a spin coater, and further rotated at a rotation speed of 600 rpm for 60 seconds to obtain a coating film (after application of the second coating liquid). The obtained coating film (after application of the second coating liquid) was hard-baked at a pressure of 30 kPa, at 350° C. for 10 minutes in nitrogen, using a hot plate, to obtain a coating film (after 10 minutes of hard baking). The obtained coating film (after 10 minutes of hard baking) was further hard-baked at a pressure of 30 kPa, at 350° C. for 20 minutes (30 minutes in total from the start of hard baking) in nitrogen.

In the process after the start of hard baking described above, the film thickness of the coating film after 10 minutes from the start of hard baking (hereinafter, also referred to as "after 10 minutes of hard baking"), the film thickness of the coating film after 20 minutes after the start of hard baking (hereinafter, referred to as "after 20 minutes of hard baking") and the film thickness of the coating film after 30 minutes from the start of hard baking (hereinafter, also referred to as "after 30 minutes of hard baking") were measured, respectively.

Further, based on the film thickness of the coating film after 10 minutes of hard baking and the film thickness of the coating film after 30 minutes of hard baking, the residual film rate (%) after heat treatment for 30 minutes was obtained by the aforementioned Formula (1). The thickness of the coating film after 10 minutes of hard baking was defined as "Film thickness of film heat-treated for 10 minutes" in Formula (1), and the film thickness of the coating film after 30 minutes of hard bake was defined as "Film thickness of film heat-treated for 30 minutes" in Formula (1).

The film thickness of the coating film was measured by an ordinary method using an ellipsometer of an optical porosimeter (PS-1100) manufactured by Semilab Japan KK.

As to the coating films prepared above, the film obtained by using the terephthalic acid coating liquid as the second coating liquid was defined as film m, the film obtained by using the phthalic acid coating liquid as the second coating liquid was defined as film n, the film obtained by using the acetic acid coating liquid (the second coating liquid for comparison) as the second coating liquid was defined as film o, and the film that was not subjected to the second step after the first step was defined as film p.

The measurement results of the film thickness and residual film rate after heat treatment for 30 minutes of these films are shown in Table 1 below.

TABLE 1

| | First Coating Liquid | | | Second Coating Liquid | | | Film Thickness of Coating Film after Hard Baking (nm) | | | Residual Film Rate after Heat Treatment for 30 Minutes (%) |
|---|---|---|---|---|---|---|---|---|---|---|
| | Mw of PEI | Concentration (% by Mass) | pH | First Solvent | Carboxylic Acid | Concentration (% by Mass) | Second Solvent | After 10 Minutes | After 20 Minutes | After 30 Minutes | |
| Film m | 25000 | 4 | 10.5 | $H_2O$ | Terephthalic Acid | 0.1 | IPA | 24.9 | 26.3 | 24.7 | 99 |
| Film n | 25000 | 4 | 10.5 | $H_2O$ | Phthalic Acid | 2 | IPA | 29.2 | 30.1 | 23.9 | 82 |
| Film o | 25000 | 4 | 10.5 | $H_2O$ | Acetic Acid | 3 | IPA | 114.2 | 52.1 | 12.5 | 11 |
| Film p | 25000 | 4 | 10.5 | $H_2O$ | — | — | — | 61.8 | 18.5 | 10.1 | 16 |

As shown in Table 1, it was found that both the film m and the film n using a divalent carboxylic acid (terephthalic acid, phthalic acid) as the carboxylic acid in the second coating liquid remained even after heated (hard-baked) at 350° C., and also had a residual film rate after heat treatment for 30 minutes of 30% or more and a heat resistance of 350° C. On the other hand, it was found that the film o using a monovalent carboxylic acid (acetic acid) (carboxylic acid for comparison) as the carboxylic acid in the second coating liquid and the film p not using the second coating liquid do not have a heat resistance of 350° C.

Thus, it is understood that a film having a heat resistance of 350° C. is obtained by using a divalent carboxylic acid as the carboxylic acid in the second coating liquid.

Experimental Example 2

In Experimental Example 2, the metal element content in the coating film was measured (Table 2 below).

The metal element content was measured with Total Reflection X-ray Fluorescence Spectrometer (Rigaku TXRF 300).

As the measurement sample, the following sample (film q) was prepared.

(First Coating Step)

As the first coating liquid, a polyethyleneimine (PEI) coating liquid (weight-average molecular weight of PEI: 25000, first solvent: water, PEI content: 4% by mass) was prepared. PEI was used after removing metal and halogen.

1 mL of the first coating liquid was discharged onto the surface of a flat silicon wafer substrate (gyp 300 mm) placed on a spin coater, using a pipette, then the flat silicon wafer substrate was rotated at a rotation speed of 1000 rpm for 1 second, and further rotated at a rotation speed of 600 rpm for 60 seconds to obtain a dry coating film. The obtained dry coating film was soft-baked in the air at 125° C. for 1 minute on a hot plate (SPX-1120 manufactured by Apex Corporation) to obtain a coating film (after soft baking).

(Second Coating Step)

As the second coating liquid, a trimesic acid coating liquid (second solvent: isopropyl alcohol (IPA), trimesic acid content: 1.5% by mass) was prepared.

10 mL of the second coating liquid was discharged onto the coating film obtained in the second coating step (after soft baking), rotated by a spin coater for 1 second, and further rotated at a rotation speed of 600 rpm for 60 seconds to obtain a coating film (after application of the second coating liquid). The obtained coating film (after application of the second coating liquid) was hard-baked at 250° C. for 10 minutes, using a hot plate, to obtain a coating film (after 10 minutes of hard baking). The obtained coating film (after 10 minutes of hard baking) was further heated in nitrogen at 400° C. for 10 minutes to obtain a film q.

The film thickness of the obtained film q was measured to be 138.7 nm.

The metal content of the obtained film q was measured under the following conditions.

X-ray: 30 kV, 300 mA

Number of measurement points in wafer: 5 points

Beam:

W-M Φ0.400 deg, measurement time 500 sec, measurement direction 35 deg

W-Lb Φ0.100 deg, measurement time 500 sec, measurement direction 35 deg

H. E Φ0.050 deg, measurement time 500 sec, measurement direction 35 deg

The measurement results are shown in Table 2.

TABLE 2

| Wafer Coordinates | | | | | | | | | | | | | | | | | | |
|---|---|---|---|---|---|---|---|---|---|---|---|---|---|---|---|---|---|---|
| x (mm) | y (mm) | Na | Mg | Al | S | K | Ca | Ti | Cr | Mn | Fe | Co | Ni | Cu | Zn | Mo | Cs | Hf |
| 0 | 0 | N.D. | N.D. | N.D. | N.D. | N.D. | N.D. | N.D. | N.D. | N.D. | 0.03 | N.D. | 0.3 | N.D. | N.D. | N.D. | N.D. | N.D. |
| −120 | 0 | N.D. | N.D. | N.D. | N.D. | N.D. | N.D. | 0.22 | N.D. | N.D. | N.D. | N.D. | N.D. | N.D. | 0.2 | N.D. | N.D. | N.D. |
| 0 | −120 | N.D. | N.D. | N.D. | N.D. | N.D. | N.D. | 0.31 | N.D. | N.D. | 0.2 | N.D. | N.D. | N.D. | N.D. | N.D. | N.D. | N.D. |
| 120 | 0 | N.D. | N.D. | N.D. | N.D. | N.D. | N.D. | 0.1 | N.D. | N.D. | 0.1 | N.D. | N.D. | N.D. | N.D. | N.D. | N.D. | N.D. |
| 0 | 120 | N.D. | N.D. | N.D. | N.D. | N.D. | N.D. | N.D. | N.D. | N.D. | 0.02 | N.D. | N.D. | N.D. | N.D. | N.D. | N.D. | N.D. |
| Maximum Value of 5 Point Measurement × $10^{10}$ (atom/cm$^2$) | | N.D. | N.D. | N.D. | N.D. | N.D. | N.D. | 0.31 | N.D. | N.D. | 0.24 | N.D. | 0.29 | N.D. | 0.19 | N.D. | N.D. | N.D. |

N.D.: Detection Limit or Less

As shown in Table 2, the detected metal contents were all $5\times10^{10}$ atoms/cm$^2$ or less even at the maximum value obtained by measuring 5 points in the φ 300 mm silicon wafer.

Experimental Example 3

As Experimental Example 3, an experiment concerning the relationship between the kind of the second solvent and the thickness of the film (filling property into the recessed part) was conducted (Table 3 below). Since Experimental Example 3 is an experiment for confirming the influence of the second solvent on the polyamine, no organic substance having two or more carboxyl groups was used in Experimental Example 3.

In detail, a polyethyleneimine (PEI) coating liquid (weight-average molecular weight of PEI: 25000, first solvent: water, PEI content: 3% by mass) as the first coating liquid was applied to the flat silicon wafer surface by a spin coater, and then soft-baked (100° C., 1 min) to obtain a coating film (after soft baking). The film thickness of the obtained coating film (after soft baking) was measured. The film thickness of the obtained coating film (after soft baking) was shown in the column "After Soft Baking" that is the last line of Table 3.

After soft baking, 40 mL of the second solvent (each solvent type shown in Table 3) was applied to the surface of the coating film, and then hard-baked at 350° C. for 2 minutes.

The film thickness of the coating film after hard baking was measured.

The following Table 3 shows the boiling point (bp), log (Pow), and SP value of each solvent type, and also shows the measurement result of the film thickness of the coating film after hard baking.

TABLE 3

| Second Solvent | bp (° C.) | log (Pow) | SP Value ((MPa)$^{1/2}$) | Thickness of Film (nm) |
|---|---|---|---|---|
| Cyclohexane | 81 | + | 16.8 | N.D. |
| DMAc | 166 | −0.77 | 17.2 | N.D. |
| Toluene | 110.6 | + | 18.2 | N.D. |
| PGMEA | 146 | 0.36 | 19.3 | 41.9 |
| Cyclopentanone | 130.6 | 0.24 | 22.1 | N.D. |
| 2-BtOH | 99.5 | 0.61 | 22.2 | 38.9 |
| NMP (Comparative Solvent) | 202 | −0.38 | 23.0 | N.D. |
| 1-BtOH | 117 | 0.90 | 23.2 | N.D. |
| IPA | 82.5 | 0.05 | 23.5 | 27.5 |
| 1-PrOH | 97.2 | 0.25 | 24.6 | 11.2 |
| DMF | 153 | −0.87 | 24.9 | N.D. |
| γ-butyrolactone (Comparative Solvent) | 204 | −0.57 | 26.3 | N.D. |
| EtOH | 78.3 | −0.32 | 26.6 | 10.3 |
| MeOH | 64.5 | −0.82 | 29.7 | N.D. |
| Water (Comparative Solvent) | 100 | — | 47.9 | 7.2 |
| After Soft Baking | | | | 38.0 |

~Description of Table 3~
Water, NMP, and γ-butyrolactone are comparative solvents that do not correspond to the second solvent.
"+" in the log (Pow) column indicates more than +1.0.
"Thickness of the film" in the lines other than the last line indicates the thickness of the film after application of the first coating liquid, soft baking, application of the second solvent, and hard baking.
"Thickness of the film" in the last line ("After Soft Baking") indicates the thickness of the film after application of the first coating liquid and soft baking.
"N.D." means no measurement result (No Data).
"NMP" means N-methyl-2-pyrrolidone.

As shown in Table 3, when a second solvent having an SP value of 30 (MPa)$^{1/2}$ or less was used, the thickness of the film after hard baking was large.

In contrast, when water having an SP value of 47.1 (MPa)$^{1/2}$, which is a comparative solvent, was used, the thickness of the film after hard baking was decreased. The reason for this is considered that the polyamine was dissolved in the comparative solvent (water).

Furthermore, it was confirmed that, among the second solvents having an SP value of 30 (MPa)$^{1/2}$ or less, when a second solvent having an SP value of 24 (MPa)$^{1/2}$ or less is used, a coating film having a particularly large film thickness is obtained.

From the results of Experimental Example 3 above, it is understand that, when a second solvent having an SP value of 30 (MPa)$^{1/2}$ or less, particularly preferably a second solvent having an SP value of 24 (MPa)$^{1/2}$ or less is used, dissolution of polyamine in the second coating step is suppressed, and a filling planarization film having excellent filling property into the recessed part is obtained.

Experimental Example 4

As Experimental Example 4, a second coating liquid containing an organic substance having two or more carboxyl groups and a second solvent was prepared, and an experiment concerning the relationship between the kind of the second solvent and the film thickness of the coating film (filling property into the recessed part) was conducted (Table 4 below).

—Preparation of Film A (for Comparison)—
A polyethyleneimine (PEI) coating liquid (weight-average molecular weight of PEI: 25000, first solvent: water, PEI content: 3% by mass) as the first coating liquid was applied to the flat silicon wafer surface by a spin coater, and then soft-baked (100° C., 1 min) to obtain a film A for comparison.

—Preparation of Film B (for Comparison)—
A comparative coating liquid (TMSA content: 3% by mass) in which trimesic acid (TMSA) (trivalent carboxylic acid) as the organic substance having two or more carboxyl groups was dissolved in a comparative solvent (water) was applied to the surface of the film A to obtain a film B for comparison.

—Preparation of Film C—
A second coating liquid (TMSA content: 3% by mass) in which trimesic acid (TMSA) (trivalent carboxylic acid) as the organic substance having two or more carboxyl groups was dissolved in a second solvent (ethanol (EtOH)) was applied to the surface of the film A to obtain a film C.

—Preparation of Film D—
A second coating liquid (TMSA content: 3% by mass) in which trimesic acid (TMSA) (trivalent carboxylic acid) as the organic substance having two or more carboxyl groups was dissolved in a second solvent (isopropyl alcohol (IPA)) was applied to the surface of the film A to obtain a film D.

—Hard Baking—
Each of film A to film D was hard-baked at 400° C. for 10 minutes and further at the same temperature (400° C.) for 20 minutes (30 minutes in total from the start of hard baking).

—Film Thickness Measurement—

As to the film A, the film thickness after soft baking, the film thickness after 10 minutes of hard baking, and the film thickness after 30 minutes of hard baking were measured, respectively.

As to the film B, the film thickness after application of the comparative coating liquid, the film thickness after 10 minutes of hard baking, and the film thickness after 30 minutes of hard baking were measured, respectively.

As to each of the film C and the film D, the film thickness after application of the second coating liquid, the film thickness after 10 minutes of hard baking, and the film thickness after 30 minutes of hard baking were measured, respectively.

Based on the measured film thickness after 10 minutes of hard baking and film thickness after 30 minutes of hard baking, the residual film rate (%) after heat treatment for 30 minutes was obtained by the aforementioned Formula (1). The thickness of the coating film after 10 minutes of hard baking was defined as "Film thickness of film heat-treated for 10 minutes" in Formula (1), and the film thickness of the coating film after 30 minutes of hard bake was defined as "Film thickness of film heat-treated for 30 minutes" in Formula (1).

The film thickness of each film and the residual film rate after heat treatment for 30 minutes are shown in Table 4 below.

In contrast to the film A and film B, in the film C obtained by applying the first coating liquid and performing soft baking, and further applying the second coating liquid containing EtOH as the second solvent, the film did not dissolve even by application of the second coating liquid. Rather, by the application of the second coating liquid, the film thickness increased more than the film thickness before application of the second coating liquid (that is, after soft baking of the film A (described in the column of "After Application of Second Coating Liquid" of the film A, for convenience. The same shall apply hereinafter.) (refer to the film thickness of the film C after application of the second coating liquid). As a result, in the film C, the film thickness after 10 minutes of hard baking was 59 nm, and the coating film sufficiently remained even after hard baking. Furthermore, the residual film rate after heat treatment for 30 minutes was 93%, and the film C had sufficient heat resistance.

Similarly, in the film D obtained by applying the first coating liquid and performing soft baking, and further applying the second coating liquid containing IPA as the second solvent, the film was not dissolved even by application of the second coating liquid. Rather, by the application of the second coating liquid, the film thickness increased more than the film thickness before application of the second coating liquid (that is, after soft baking of the film A) (refer to the film thickness of the film D after application

TABLE 4

| | | Film A (for Comparison) | Film B (for Comparison) | Film C | Film D |
|---|---|---|---|---|---|
| Second Solvent | | | Water (Comparative Solvent) | EtOH | IPA |
| Film Thickness (nm) | After Application of Second Coating Liquid | 190 (After Soft Baking) | 6.7 (After Application of Coating Liquid for Comparison) | 360 | 296 |
| | Hard Baking 400° C. after 10 Minutes | 0.1 | 0.8 | 59 | 82 |
| | Hard Baking 400° C. after 30 Minutes | — | — | 55 | 71 |
| Residual Film Rate after Heat Treatment for 30 Minutes (%) | | — | — | 93 | 87 |

—: Unmeasurable

~Description of Table 4~

The film thickness of the film A (for comparison) after soft baking was described in the column "After Application of Second Coating Liquid", for convenience.

The film thickness of the film B (for comparison) after application of the comparative coating liquid was described in the column "After Application of Second Coating Liquid", for convenience.

As shown in Table 4, in the film A (for comparison) obtained by applying the first coating liquid and performing soft baking, without applying the second coating liquid, the film disappeared due to hard baking, and the relative film thickness after 10 minutes of hard baking was only 0.1 nm.

Also, in the film B (for comparison) obtained by applying the first coating liquid and performing soft baking, and further applying a comparative coating liquid containing water as a comparative solvent, the film was dissolved by water in the comparative coating liquid, and the film thickness was already only 6.7 nm, at the stage after application of the comparative coating liquid (that is, the stage before hard baking).

of the second coating liquid). As a result, in the D film, the film thickness after hard baking was 82 nm, and the coating film sufficiently remained even after hard baking. Furthermore, the residual film rate after heat treatment for 30 minutes was 87%, and the film D had sufficient heat resistance.

From the results of Experimental Example 4 above, it is understand that, when a second solvent (for example, EtOH, IPA) having an SP value of 30 $(MPa)^{1/2}$ or less is used, dissolution of polyamine in the second coating liquid is suppressed, and a filling planarization film having excellent filling property into the recessed part is obtained.

Experimental Example 5

As Experimental Example 5, an experiment concerning the relationship between the valence of carboxylic acid as the organic substance having two or more carboxyl groups and heat resistance of the film was conducted (Table 5 below).

In detail, a polyethyleneimine (PEI) coating liquid (weight-average molecular weight of PEI: 25000, first solvent: water, PEI content: 3% by mass) as the first coating liquid was applied to the flat silicon wafer surface by a spin coater, and then soft-baked (100° C., 1 min) to obtain a coating film (after soft baking).

A second coating liquid (carboxylic acid content: 1.5% by mass) in which the carboxylic acid shown in Table 5 was dissolved in a second solvent (EtOH) was applied onto the obtained coating film (after soft baking), and the film thickness (film thickness before hard baking) of the obtained coating film was measured. Next, the coating film was hard-baked at 380° C. for 10 minutes, and the film thickness (film thickness after hard baking) of the obtained coating film was measured.

Based on the film thickness before hard baking and film thickness after hard baking measured as above, the residual film rate (%) after hard baking was obtained by the following formula. The results are shown in Table 5.

Residual film rate after hard baking (%)=(Film thickness after hard baking/Film thickness before hard baking)×100

TABLE 5

| Carboxylic Acid in Second Coating Liquid | | Residual Film Rate after Hard Baking (%) |
|---|---|---|
| Kind | Valence | |
| None | — | 0.1 |
| AA | 1 | 0.4 |
| PA | 2 | 0.3 |
| TMA | 3 | 64 |
| TMSA | 3 | 78 |
| PMDA | 4 | 54 |

~Description of Table 5
The kinds of carboxylic acids are as follows.
AA Acetic acid
PA Phthalic acid
TMA Trimellitic acid
TMSA Trimesic acid
PMDA Pyromellitic acid The kind of carboxylic acid "None" indicates that a carboxylic acid was not contained in the second coating liquid.

As shown in Table 5, in a case in which a trivalent or higher-valent carboxylic acid (TMA, TMSA, and PMDA) was used as the organic compound having two or more carboxyl groups in the second coating liquid, the residual film rate after hard baking was particularly high, and the coating film sufficiently remained even when hard-baked at 380° C. for 10 minutes. That is, in this case, it was found that a filling planarization film having particularly high heat resistance can be formed.

Experimental Example 6

As Experimental Example 6, an experiment concerning the formation of an amide bond and an imide bond by a reaction of a polyamine and a carboxylic acid was conducted.

Formation of an amide bond and an imide bond was confirmed by Fourier transform infrared spectroscopy (FT-IR) measurement.

—Preparation of Film E (for Comparison)—

A polyethyleneimine (PEI) solution (weight-average molecular weight of PEI: 25000, solvent: mixed solvent of mass ratio [ethanol/water]=1/3, PEI content: 3% by mass) was applied to the flat silicon wafer surface by a spin coater, and then soft-baked (100° C., 1 min) to obtain a film E as a film for comparison.

As to the obtained film E, the presence or absence of an amide bond and an imide bond was confirmed by FT-IR measurement.

As a result, neither a peak derived from an amide bond nor a peak derived from an imide bond was observed.

—Preparation of Film F (for Comparison)—

An aqueous solution of polyethyleneimine (PEI) and acetic acid (weight-average molecular weight of PEI: 25000, solvent: water, PEI content: 1.2% by mass, acetic acid content: 1.4% by mass) was applied to the flat silicon wafer surface by a spin coater, and then soft-baked (100° C., 1 min) to obtain a film F as a film for comparison.

As to the obtained film F, the presence or absence of an amide bond and an imide bond was confirmed by FT-IR measurement.

As a result, a weak peak derived from an amide bond was observed. No peak derived from an imide bond was observed.

—Preparation of Film G—

A second coating liquid (TMSA content: 2% by mass) in which trimesic acid (TMSA) (trivalent carboxylic acid) as the organic substance having two or more carboxyl groups was dissolved in a second solvent (isopropyl alcohol) was applied to the surface of the film E, and then hard-baked at 400° C. for 10 minutes to obtain a film G.

As to the obtained film the presence or absence of an amide bond and an imide bond was confirmed by FT-IR measurement.

As a result, a strong peak derived from an amide bond was observed. No peak derived from an imide bond was observed.

—Preparation of Film H—

A second coating liquid (TMA content: 2% by mass) in which trimellitic acid (TMA) (trivalent carboxylic acid) as the organic substance having two or more carboxyl groups was dissolved in a second solvent (ethanol) was applied to the surface of the film E, and then hard-baked at 350° C. for 2 minutes to obtain a film H.

As to the obtained film H, the presence or absence of an amide bond and an imide bond was confirmed by FT-IR measurement.

As a result, a strong peak derived from an amide bond and a strong peak derived from an imide bond were observed.

<Removal of Filling Planarization Film>

The filling planarization film (in particular, a filling planarization film in a mode satisfying at least one of the facts that the content of the metal element is $5 \times 10^{10}$ atoms/cm$^2$ or less per one kind of the metal element, and the thickness of the filling planarization film is 100 nm or more) may be a film to be removed in a later step (that is, a sacrificial film).

In particular, in the field of semiconductor devices, there is a request to remove the filling planarization film, after several semiconductor processes.

Examples of treatments for removing the filling planarization film include UV ozone treatment or plasma treatment.

The UV ozone treatment for removing the filling planarization film can be performed by irradiating UV (ultraviolet light) under an oxygen atmosphere. By irradiating UV (ultraviolet light) under an oxygen atmosphere, ozone is generated, and the filling planarization film is removed by this ozone.

In addition, the plasma treatment for removing the filling planarization film can be performed using plasma generated from at least one gas selected from the group consisting of oxygen gas and fluorocarbon gas. Examples of the fluorocarbon gas include $CF_4$, $C_4F_8$, and the like.

Specifically, dry etching is preferable as plasma treatment, and among dry etching, reactive ion etching is more preferable.

As to the plasma treatment for removing the filling planarization film, for example, the dry etching method described in JP-A No. 2011-171572 can be referred to, if appropriate.

In a case in which a divalent carboxylic acid is used as the organic substance having two or more carboxyl groups in the second coating liquid, examples of the treatment for removing the filling planarization film includes a treatment of heating the filling planarization film to 380° C. or more, in addition to the UV ozone treatment and the plasma treatment.

When the organic substance having two or more carboxyl groups in the second coating liquid is a divalent carboxylic acid, the filling planarization film has particularly excellent removability.

Experimental Example 7

As Experimental Example 7, an experiment concerning the removal of the filling planarization film by UV ozone treatment was conducted.

—Preparation of Film I—

A polyethyleneimine (PEI) coating liquid (weight-average molecular weight of PEI: 25000, solvent: mass ratio [ethanol/water]=1/3, PEI content: 3% by mass) was applied to the flat silicon wafer surface by a spin coater, and then soft-baked (100° C., 1 min) to obtain a coating film.

A second coating liquid (TMA content: 2% by mass) in which trimellitic acid (TMA) (trivalent carboxylic acid) was dissolved in a second solvent (ethanol) was applied to the surface of the obtained coating film, and then hard-baked at 380° C. for 10 minutes to obtain a film I having a film thickness of 100 nm.

—UV Ozone Treatment—

The obtained film I was subjected to UV irradiation under an oxygen atmosphere (UV ozone treatment) under the following conditions.

—Conditions for UV Ozone Treatment—

Pressure of 30 kPa, $O_2/N_2$=20 ($cm^3$/min.)/600 ($cm^3$/min.), 400° C., 30 min, UV ($\lambda$=172 nm, 14 $mW/cm^2$)

As a result, it was confirmed that the film I having a film thickness of 100 nm was completely removed in 30 minutes by the UV ozone treatment under the above conditions.

—Preparation of Film J and UV Ozone Treatment—

The same procedure was carried out as in the preparation of film I described above, except for changing the second coating liquid (TMA content: 2% by mass) in which trimellitic acid (TMA) (trivalent carboxylic acid) was dissolved in a second solvent (ethanol) in the preparation of film I to a second coating liquid (1,2,3-PTCA content: 2% by mass) in which 1,2,3-propanetricarboxylic acid (1,2,3-PTCA) (trivalent carboxylic acid) was dissolved in a second solvent (isopropyl alcohol), to obtain a film J having a film thickness of 40 nm.

When the obtained film J was subjected to UV ozone treatment under the above conditions, it was confirmed that the film J having a film thickness of 40 nm was completely removed in 10 minutes.

Experimental Example 8

As Experimental Example 8, an experiment of removing a filling planarization film using phthalic acid (divalent carboxylic acid) as the organic substance having two or more carboxyl groups by heat treatment was conducted.

—Preparation of Film K—

A solution in which polyethyleneimine (PEI) and phthalic acid (PA) was dissolved in a solvent (weight-average molecular weight of PEI: 25000, solvent:mass ratio [ethanol/water]=1/3, PEI content: 1.5% by mass, PA content: 2% by mass) was applied to the flat silicon wafer surface by a spin coater, and then soft-baked (100° C., 1 min) to obtain a film K having a film thickness of 66.1 nm.

—Preparation of Film L—

A polyethyleneimine (PEI) solution (weight-average molecular weight of PEI: 25000, solvent: mass ratio [ethanol/water]=1/3, PEI content: 1.5% by mass) was applied to the flat silicon wafer surface by a spin coater, and then soft-baked (100° C., 1 min) to obtain a coating film.

A second coating liquid (PA content: 2% by mass) in which phthalic acid (PA) was dissolved in a second solvent (ethanol) was applied to the surface of the obtained coating film to obtain a film L having a film thickness of 113.9 nm.

—Heating Removing Treatment—

Each of the film K and the film L was subjected to a heating removing treatment at 380° C. for 30 minutes.

From the film thickness after soft baking and the film thickness after the heating removing treatment, the residual film rate after the heating removing treatment was obtained by the following formula.

Residual film rate (%) after heat treatment=(Film thickness of film after heat treatment/Film thickness of film after soft baking)×100

As a result, the residual film rate of the film K after heating removing treatment was only 0.5%, and the film K was almost removed by the heating removing treatment.

The residual film rate of the film L after heating removing treatment was only 0.5%, and the film L was almost removed by the heat removing treatment.

From the results of Experimental Example 8 above, it was confirmed that, in a case in which a divalent carboxylic acid is used as the organic substance having two or more carboxyl groups in the second coating liquid, the filling planarization film can be removed by heating the filling planarization film to 380° C. or more.

Experimental Example 9

As Experimental Example 9, an experiment concerning the formation of an amide bond by a reaction of a polyamine and a carboxylic acid in the depth direction was conducted.

The formation of an amide bond in the depth direction was confirmed by Time of Flight-Secondary Ion Mass Spectrometry (TOF-SIMS). TOF-SIMS measurement was performed with "TOF.SIMS5" (manufactured by ION-TOF GmbH).

—Preparation of Film M—

An aqueous solution of polyethyleneimine (PEI) (weight-average molecular weight of PEI: 25000, solvent: water, PEI content: 3% by mass) was applied to the flat silicon wafer surface by a spin coater, and then soft-baked (100° C., 1 min) to obtain a coating film.

A second coating liquid (TMSA content: 2% by mass) in which trimesic acid (TMSA) (trivalent carboxylic acid) as the organic substance having two or more carboxyl groups was dissolved in a second solvent (isopropyl alcohol) was applied to the surface of the obtained coating film, and then hard-baked at 400° C. for 10 minutes to obtain a film M.

As to the obtained film M, the presence or absence of an amide bond in the depth direction was confirmed by TOF-SIMS measurement.

Figure 2:
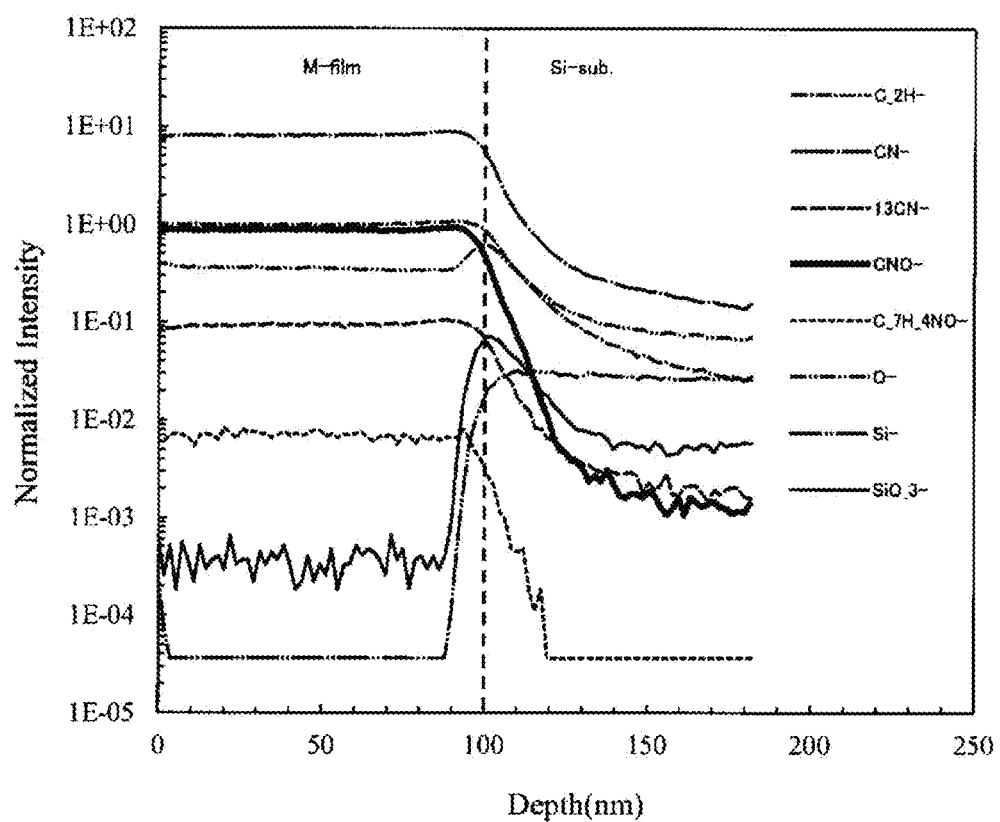
FIG. 2 is a graph showing results of TOF-SIMS measurement in Experimental Example 9.

The results of TOF-SIMS measurement are shown in FIG. 2.

In FIG. 2, the horizontal axis represents the depth (unit: nm) of the measurement object, and the vertical axis represents the normalized intensity of the secondary ion (Normalized Intensity).

In FIG. 2, the point at a depth of 0 nm shows the surface of the film M, the region at a depth of from 0 nm to 100 nm shows the film M (M-film), and the region deeper than a depth of 100 nm shows the silicon wafer (Si-sub.).

In FIG. 2, "C_2H—" is the intensity of secondary ions derived from general organic substances, "CN—" and "13CN—" are the intensities of secondary ions derived from general organic substances including nitrogen, "CNO—" is the intensity of a secondary ion derived from an amide, and the like, "C_7H_4NO—" is the intensity of a secondary ion derived from an aromatic amide, and the like, "O—" is the intensity of a secondary ion derived from oxygen, and "Si—" and "SiO_3-" are the intensities of secondary ions derived from silicon and an silicon oxide.

As shown in FIG. 2, amide bonds were detected with almost the same intensity, over almost the entire region in the depth direction of the film M, from the surface of the film M to the vicinity of the silicon wafer.

From the results of TOF-SIMS, it was found that the organic substance having two or more carboxyl groups in the second coating liquid reacted not only on the coating film surface of the first coating liquid but also in the entire coating film.

[Method for Manufacturing Electronic Device]

The method for manufacturing an electronic device of the embodiment includes a filling planarization film forming step of forming the filling planarization film, on a semiconductor substrate or circuit substrate which is a member having the recessed part, by the above-mentioned method for manufacturing a filling planarization film of the embodiment.

According to the method for manufacturing an electronic device of the embodiment, a semiconductor substrate or a circuit substrate is manufactured as an electronic device. This electronic device is provided with a filling planarization film having excellent filling property (embeddability) into the recessed part and excellent heat resistance.

The filling planarization film is also excellent in plasma resistance.

The method for manufacturing an electronic device of the embodiment may include other steps.

Examples of the other steps include known steps in the semiconductor process or the circuit board process.

For example, the method for manufacturing an electronic device of the embodiment may include a plasma step as the other step.

Examples of the plasma in the plasma step includes plasma generated from at least one gas selected from the group consisting of helium gas, argon gas, nitrogen gas, ammonia gas, and fluorocarbon gas.

Even in a case in which the method for manufacturing an electronic device of the embodiment has a plasma step, damage of the filling planarization film due to the plasma is reduced.

In addition, the method for manufacturing an electronic device of the embodiment may include a removing step of removing the filling planarization film as the other step. This mode is particularly suitable in a case in which the filling planarization film is a sacrificial film.

Examples of the method of removing the filling planarization film in the removing step include the above-mentioned UV ozone treatment, or plasma treatment as a removing treatment of the filling planarization film.

In a case in which a divalent carboxylic acid is used as the organic substance having two or more carboxyl groups, the removal method may be a method of heating the semiconductor device or the circuit substrate on which the filling planarization film is formed to 380° C. or more.

EXAMPLES

Hereinafter, the present invention will be more specifically described with reference to examples, but the present invention is not limited to the following examples.

Example 1

<Preparation of Member Having Recessed Part>

As a member having a recessed part, a silicon wafer 1 on which a groove (aspect ratio of 3.6, width of 50 nm, depth of 180 nm) was formed was prepared.

<Preparation of Coating Liquid a1 (First Coating Liquid)>

Coating liquid a1 (first coating liquid) (PEI content: 3% by mass, pH (25° C.) of 10.5) in which polyethyleneimine (PEI, manufactured by BASF, brand name: Rupasol WF, weight-average molecular weight: 25000) that is polyamine was dissolved in water as the first solvent was prepared.

<Preparation of Coating Liquid a2 (Second Coating Liquid)>

Coating liquid a2 (second coating liquid) (TMSA content: 1.5% by mass) in which trimesic acid (TMSA) (trivalent carboxylic acid) (manufactured by Aldrich) was dissolved in isopropyl alcohol (IPA; SC Grade manufactured by Wako Pure Chemical Industries, Ltd.) as the second solvent was prepared.

<First Coating Step>

The silicon wafer 1 was placed on a spin coater (manufactured by ABLECo. Ltd.), and 1 mL of the coating liquid a1 (first coating liquid) was discharged onto the groove-formed surface of the silicon wafer 1 using a pipette, then the silicon wafer 1 was rotated at a rotation speed of 1,000 rpm for 1 second, and further at a rotation speed of 600 rpm for 60 seconds to obtain a dry coating film. Subsequently, the dry coating film was soft-baked (100° C., 1 min) on a hot plate in the air to obtain a coating film (after soft baking). The silicon wafer on which the coating film (after soft baking) is formed is hereinafter also referred to as "coating film-formed silicon wafer".

<Second Coating Step>

The coating film-formed silicon wafer obtained in the first coating step was placed on a spin coater, and 1 mL of the coating liquid a2 (second coating liquid) was discharged onto the surface of the coating film of the coating film-formed silicon wafer, and then dried by rotating at a rotation speed of 1,000 rpm for 1 second and further at a rotation speed of 600 rpm for 60 seconds to obtain a coating film (after application of the second coating liquid). The obtained coating film (after application of the second coating liquid) was hard-baked in nitrogen, at a pressure of 30 kPa, at 400° C. for 30 minutes, using a hot plate (SPX-1120 manufactured by Apex Corporation).

As a result, a filling planarization film (filling planarization film 100 in FIG. 1) was obtained.

The cross section of the silicon wafer with a filling planarization film thus manufactured was observed with a scanning electron microscope (SEM), and an SEM photograph (magnification: 200,000 times) was taken.

The obtained SEM photograph is shown in FIG. 1.

In FIG. 1, "Si" represents a silicon wafer, and "100" represents a filling planarization film.

As shown in FIG. 1, it was found that filling planarization film 100 was filled inside the groove without generating a void.

The obtained filling planarization film 100 is considered to be a film obtained by hard baking at 400° C. for 30 minutes (that is, a film remained after this hard baking), and that an amide bond is formed by the amino group of PEI and the carboxyl group of TMSA, thus is considered to be a film having excellent heat resistance. For the same reason, filling planarization film 100 is considered to be a film also having excellent plasma resistance.

Example 2

<Preparation of Member Having Recessed Part>

As a member having a recessed part, a silicon wafer 2 on which a groove (aspect ratio of 0.67, width of 180 nm, depth of 120 nm) was formed was prepared.

The silicon wafer 2 is a silicon wafer with an $SiO_2$ film.

In detail, an $SiO_2$ film was formed on a silicon wafer by plasma CVD, and then a part of the $SiO_2$ film was removed by photolithography and dry etching to form the groove. Thus, a silicon wafer 2 was obtained.

<Preparation of Coating Liquid b2 (Second Coating Liquid)>

Coating liquid b2 (second coating liquid) (PMDA content: 2.5% by mass) in which pyromellitic acid (PMDA) (tetravalent carboxylic acid) (manufactured by Lonza Japan) was dissolved in ethanol (EtOH; SC Grade manufactured by Wako Pure Chemical Industries, Ltd.) as the second solvent was prepared.

<First Coating Step>

A coating film-formed silicon wafer was obtained in the same manner as in the first coating step of Example 1 except for using the silicon wafer 2 in place of the silicon wafer 1.

<Second Coating Step>

A coating film (after application of the second coating liquid) was obtained in the same manner as in the second coating step of Example 1, by using the second coating liquid b2 on the surface of the coating film-formed silicon wafer obtained in the first coating step. The obtained coating film (after application of the second coating liquid) was hard-baked in the same manner as in Example 1 except for changing the temperature to 380° C.

The cross section of the silicon wafer with the filling planarization film thus manufactured was observed with a transmission electron microscope (TEM), and a TEM photograph (magnification: 100,000 times) was photographed.

The obtained TEM photograph is shown in FIG. 3.

In FIG. 3, "Si" represents a silicon wafer, "$SiO_2$" represents a $SiO_2$ film, and "100" represents a filling planarization film.

As shown in FIG. 3, it was found that filling planarization film 100 was filled inside the groove without generating a void.

Example 3

<Preparation of Member Having Recessed Part>

As a member having a recessed part, a silicon wafer 3 on which a groove (aspect ratio of 2, width of 100 nm, depth of 200 nm) was formed was prepared.

<Preparation of Coating Liquid c2 (Second Coating Liquid)>

Coating liquid c2 (second coating liquid) (PA content: 3.0% by mass) in which phthalic anhydride (PA) (divalent carboxylic acid) (manufactured by Aldrich) was dissolved in isopropyl alcohol (IPA; SC Grade manufactured by Wako Pure Chemical Industries, Ltd.) as the second solvent was prepared.

<First Coating Step>

A coating film-formed silicon wafer was obtained in the same manner as in the first coating step of Example 1 except for using the silicon wafer 3 in place of the silicon wafer 1.

<Second Coating Step>

A coating film (after application of the second coating liquid) was obtained in the same manner as in the second coating step of Example 1, by using the second coating liquid c2 on the surface of the coating film-formed silicon wafer obtained in the first coating step.

The obtained coating film (after application of the second coating liquid) was hard-baked in nitrogen, at a pressure of 30 kPa, at 350° C. for 40 minutes, using a hot plate (SPX-1120 manufactured by Apex Corporation).

The cross section of the silicon wafer with a filling planarization film thus manufactured was observed with a scanning electron microscope (SEM), and an SEM photograph (magnification: 150,000 times) was taken.

The obtained SEM photograph is shown in FIG. 4.

In FIG. 4, "Si" represents a silicon wafer, and "100" represents a filling planarization film.

As shown in FIG. 4, it was found that filling planarization film 100 was filled inside the groove without generating a void.

Example 4

<Preparation of Coating Liquid d2 (Second Coating Liquid)>

Coating liquid d2 (second coating liquid) (PMDA content: 2.0% by mass) in which pyromellitic anhydride (PMDA) (tetravalent carboxylic acid) (manufactured by Lonza Japan) was dissolved in ethanol (EtOH; SC Grade manufactured by Wako Pure Chemical Industries, Ltd.) as the second solvent was prepared.

<First Coating Step>

A coating film-formed silicon wafer was obtained in the same manner as in the first coating step of Example 1 except for using the silicon wafer 3 in place of the silicon wafer 1.

<Second Coating Step>

A coating film (after application of the second coating liquid) was obtained in the same manner as in the second coating step of Example 1, by using the second coating liquid d2 on the surface of the coating film-formed silicon wafer obtained in the first coating step.

The obtained coating film (after application of the second coating liquid) was hard-baked in nitrogen, at a pressure of 30 kPa, at 400° C. for 10 minutes, using a hot plate (SPX-1120 manufactured by Apex Corporation).

The cross section of the silicon wafer with a filling planarization film thus manufactured was observed with a scanning electron microscope (SEM), and an SEM photograph (magnification: 150,000 times) was taken.

The obtained SEM photograph is shown in FIG. 5.

In FIG. 5, "Si" represents a silicon wafer, and "100" represents a filling planarization film.

As shown in FIG. 5, it was found that filling planarization film 100 was filled inside the groove without generating a void. Note that the granular substance in the filling planarization film 100 in FIG. 5 is irregularities formed in the cross section of the filling planarization film 100 when manufacturing a sample for SEM observation.

Comparative Example 1

A coating film-formed silicon wafer was obtained in the same manner as in the first coating step of Example 1 except for using the silicon wafer 3 in place of the silicon wafer 1.

Without applying the second coating liquid to the coating film of the coating film-formed silicon wafer, the coating film-formed silicon wafer was hard-baked in nitrogen, at a pressure of 30 kPa, at 350° C. for 30 minutes, using a hot plate (SPX-1120 manufactured by Apex Corporation). As a result, a silicon wafer with a comparative film was obtained.

The cross section of the silicon wafer with a comparative film thus manufactured was observed with a scanning electron microscope (SEM), and an SEM photograph (magnification: 150,000 times) was taken.

Figure 6:
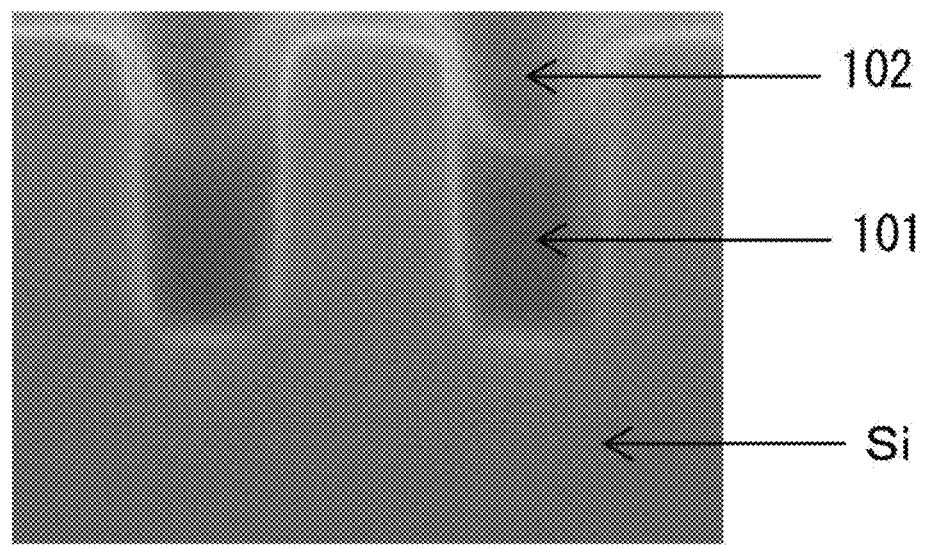
FIG. 6 is a scanning electron microscope (SEM) photograph (magnification of 150,000 times) showing a cross section of a recessed part (groove) in which a comparison film is formed, in Comparative Example 1.

The obtained SEM photograph is shown in FIG. 6.

In FIG. 6, "Si" represents a silicon wafer, "101" represents a comparative film, and "102" represents a gap in the upper part of the groove.

As shown in FIG. 6, it was found that the inside of the groove was not filled with comparative film 101, and gap 102 was formed in the upper part of the groove.

The thickness of the film heat-treated at 350° C. for 30 minutes to the film thickness of the film heat-treated for 10 minutes was 16%.

It is considered that this result shows that the polyamine of the first coating liquid shrank due to hard baking at 350° C.

From the above results, it was found that a film composed only of a polyamine not reacting with an organic substance having two or more carboxyl groups (for example, the above comparative film) has insufficient heat resistance.

The disclosure of Japanese Patent Application No. 2015-069833 is incorporated herein by reference in its entirety.

All documents, patent applications, and technical standards described in this specification are incorporated herein by reference to the same extent as if each individual document, patent application, and technical standards were specifically and individually indicated to be incorporated herein by reference.

The invention claimed is:

1. A method for manufacturing a filling planarization film, the method comprising:

a first coating step of applying a first coating liquid, containing a polyamine and a first solvent, to a region including a recessed part of a member having the recessed part, to fill the first coating liquid into the recessed part; and a second coating step of applying a second coating liquid, containing an organic substance having two or more carboxyl groups and a second solvent having a boiling point of 200° C. or less and an SP value of 30 $(MPa)^{1/2}$ or less, to the region including the recessed part of the member into which the first coating liquid has been filled, to form a filling planarization film that planarizes the region including the recessed part of the member.

2. The method for manufacturing a filling planarization film according to claim 1, wherein the organic substance having two or more carboxyl groups is a divalent or higher-valent carboxylic acid.

3. The method for manufacturing a filling planarization film according to claim 1, wherein a content of the polyamine in the first coating liquid is from 1.0% by mass to 20% by mass.

4. The method for manufacturing a filling planarization film according to claim 1, wherein the first solvent has a boiling point of 200° C. or less and is hydrophilic.

5. The method for manufacturing a filling planarization film according to claim 1, wherein the filling planarization film has an amide bond.

6. The method for manufacturing a filling planarization film according to claim 1, wherein the recessed part has a width of 250 nm or less, and has a ratio of depth to width [depth/width] of 0.3 or more.

7. The method for manufacturing a filling planarization film according to claim 1, wherein a content of a metal element in the filling planarization film per unit area is $5 \times 10^{10}$ atoms/cm² or less per one kind of the metal element.

8. A method for manufacturing an electronic device, the method comprising forming a filling planarization film on a region including a recessed part of a semiconductor substrate or of a circuit substrate having the recessed part by the method according to claim 1.

9. The method for manufacturing an electronic device according to claim 8, further comprising a step of removing the filling planarization film.

* * * * *